US006256281B1

(12) United States Patent
Tanaka et al.

(10) Patent No.: US 6,256,281 B1
(45) Date of Patent: Jul. 3, 2001

(54) VOLUME HOLOGRAPHIC MEMORY-BASED OPTICAL INFORMATION-RECORDING/ REPRODUCING APPARATUS

(75) Inventors: Satoru Tanaka; Takashi Yamaji; Hideki Hatano, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/275,430

(22) Filed: Mar. 24, 1999

(30) Foreign Application Priority Data

Mar. 27, 1998 (JP) .................................................. 10-081257

(51) Int. Cl.⁷ ...................................................... G11B 7/00
(52) U.S. Cl. ........................... 369/103; 369/112; 369/118
(58) Field of Search ............................... 369/103, 99, 100, 369/112, 1.8, 44.11, 44.12, 44.14, 44.23, 44.24, 44.27; 359/10, 11, 32, 22, 24, 25, 29

(56) References Cited

U.S. PATENT DOCUMENTS

| | | | |
|---|---|---|---|
| 5,416,616 | * | 5/1995 | Jenkins et al. .................... 369/103 X |
| 5,917,798 | * | 6/1999 | Horimai et al. ...................... 369/103 |
| 5,966,361 | * | 10/1999 | Stoll ...................................... 369/103 |

* cited by examiner

Primary Examiner—Muhammad Edun
(74) Attorney, Agent, or Firm—Sughrue, Mion, Zinn, Macpeak & Seas, PLLC (57) ABSTRACT

A volume holographic memory-based optical information-recording/reproducing apparatus being capable of controlling an interference area formed by a reference beam and a signal beam within a recording medium more easily than by waveform shaping using a lens. A recording medium is installed in the apparatus for recording a three-dimensional optical interference pattern formed by at least two coherent light beams as spatial changes in refractive index of the recording medium. A signal beam optical system transmits a coherent signal beam to the recording medium through a Fourier transform lens. A reference beam optical system transmits a coherent reference beam to the recording medium. The reference beam intersects the signal beam within the recording medium, and an angle of intersection between the reference beam and the signal beam is changed. Diffracted light of the reference beam diffracted from the recording medium is detected. Light intensity distribution-offset element is arranged in both of optical paths of the signal and reference beam optical systems, for controlling a distribution of a light intensity of the signal beam and a light intensity of the reference beam, respectively, within an area in the recording medium in which the signal beam and the reference beam intersect with each other.

12 Claims, 11 Drawing Sheets

VOLUME HOLOGRAPHIC MEMORY-BASED OPTICAL INFORMATION-RECORDING/REPRODUCING APPARATUS

BACKGROUND OF THE INVENTION

1. Field of the Invention

This invention relates to a Fourier transform hologram, and more particularly to a volume holographic memory-based optical information-recording/reproducing apparatus.

2. Description of the Related Art

When parallel light perpendicularly impinges on an image having a transmittance distribution as a dot pattern of light and dark on a plane, the parallel light is diffracted intensely in a direction perpendicular to the structure thereof.

In general, an image can be considered to be a combination of various spatial frequency components in different directions, just as an electric signal or an acoustic signal which varies with time can be considered to be constituted by various sinusoidal wave components. Mathematically, distribution of the spatial frequency components can be obtained by calculating a two-dimensional Fourier transform.

Optically determining an angular distribution of amplitude of diffracted light which is diffracted by Fraunhofer's law by causing uniform parallel light to impinge on an image is equivalent to mathematically calculating the two-dimensional Fourier transform of amplitude transmittance of the image. A Fourier transform hologram is formed by causing diffracted light from an image illuminated by coherent parallel light, i.e. a signal light to pass through a Fourier transform lens disposed apart from the illuminated image by a focal distance thereof, to thereby cause an image as a distribution of the signal light to be formed on a focal surface or Fourier surface, then causing interference between the distribution of the signal light resulting from the Fourier transform and a coherent reference beam, and recording the distribution of the signal light as interference fringes on a photosensitive material applied on a flat plate.

A wavefront recorded in the Fourier transform hologram corresponds to an image transformed through Fourier transform, so that it is required to perform inverse Fourier transform to reproduce the image from the wavefront. The inverse Fourier transform is performed by reproducing the diffracted light by illuminating the planar Fourier transform hologram with the identical reference beam and converging the diffracted light by the Fourier transform lens. Thus, the amplitude transmittance distribution of the original image is reproduced on the Fourier surface.

As described above, the planar Fourier transform hologram is capable of not only storing a hologram within a limited space but also enhancing redundancy of a record through dispersion of information in space by Fourier transform.

Another type of Fourier transform hologram is a volume hologram having a larger thickness than that of such a planar recording medium described above. Generally, the volume hologram is capable of attaining an enhanced diffraction efficiency, so that it has an advantage in recording bulk information. In the volume holographic memory, information is stored in units of two-dimensional image pages dispersed in a three-dimensional space of the recording medium.

In recent years, a recording medium, such as a photorefractive crystal of lithium niobate (LN), has drawn attention as a volume holographic memory which is capable of recording a three-dimensional interference pattern therein as spatial changes in refractive index of the recording medium.

This photorefractive effect utilized in the recording medium is a phenomenon in which electric charge generated by optical pumping moves within the crystal to form a space electric field, and the space electric field causes a linear electro-optical effect, i.e. the Pockels effect, to change the refractive index of the crystal. For example, in a ferroelectric crystal having the photorefractive properties, a change in refractive index occurs in response even to a fine optical input pattern generally having 1000 lines or more per millimeter therein. Further, the photorefractive effect is generated in real time at a response speed in the order of microseconds to seconds in dependence on the material of a crystal. Therefore, research has been carried out for various applications of the photorefractive crystal as a real-time holographic medium which does not require development of an image.

In recording digital data in the holographic memory, digital data is converted to a dot pattern image of light and dark, for example, on a plane of a panel of a transmission thin film transistor liquid crystal display (hereinafter referred to as "LCD") by using spatial optical ON/OFF signals, and interference between diffracted light from the image data, i.e. a signal beam, and a coherent reference beam is caused to record the interference pattern in a rectangular parallelepiped recording medium. In reading the digital data from the holographic memory, the image of the dot pattern is regenerated by irradiating the holographic memory with a light identical with the reference beam. The regenerated image is received by a photoelectric detector array, and an output signal from the detector array is processed by an electronic circuit to convert the same back to the digital data for reading.

The image data is recorded in a portion of the recording medium where the signal beam and the reference beam intersect with each other, so that it is possible to perform space multiple recording by properly shaping a cross section of the reference beam in a manner adapted to a shape of the recording medium. For example, if the reference beam is shaped into a beam having an elliptical cross section having a vertical length of 1 mm and a horizontal length of 4 mm, it is possible to perform multiple recording in a vertical direction, at space intervals of 1 mm. In this case, the signal beam and the reference beam are made coincident in position for recording.

Generally, the shaping of the light beams is effected by the use of lenses. However, in space multiple recording, the use of lenses makes it difficult to optimize the shape of the reference beam with respect to a recording spot.

Further, a CCD image sensor (hereinafter simply referred to as "CCD") and the LCD, each of which uses a matrix of a plurality of charge coupled devices, have been developed in the fields of techniques of image pick-up and image display, respectively, and each required to have a larger open area ratio for improvement of its performance. However, when these devices are applied in the field of digital volume holography, crosstalk between adjacent pixels is increased due to their high open area ratio, resulting in degradation of a reproduced holographic image.

Still further, conventionally, an apparatus of this kind uses a CCD having a higher open area ratio and is configured such that a brighter reproduced image can be obtained. To this end, a tolerance in positioning is limited to a value equivalent to a distance between adjacent photodetectors of the CCD (or several $\mu$m or less), which requires high assembling accuracy.

Basically, the CCD is liable to crosstalk between adjacent pixels. Therefore, as the light-receiving area is increased to obtain a higher signal level, the crosstalk between adjacent pixels becomes larger.

To overcome this problem, when the charge coupled devices used as photodetectors for a digital information-recording/reproducing apparatus, a technique is employed in which one information unit (1 bit to several bits) is formed by a plurality of pixels adjacent to each other, for example, two or four pixels, for reduction of adverse effect of crosstalk.

However, this technique suffers from redundancy of information and reduces density of recording.

Moreover, in multiple recording in which the photorefractive effect is utilized for recording information as diffraction gratings, preceding recorded diffraction gratings are progressively erased as the multiple recording of subsequent diffraction gratings proceeds. An attenuation coefficient of this erasure is referred to as the erasing time constant. It is required that measurement of an erasing time constant be carried out in advance on a medium for use in recording. The relationship in recording time between pages, which depends on the order of recording, is determined based on the erasing time constant. The operation for this determination is referred to as scheduling. Multiple recording is performed following results of the scheduling, whereby a reproduced image having a desirable brightness can be obtained.

However, crystals are different from each other in an optical constant, the response speed, the degree of polarization, the erasing time constant, etc., which makes it difficult to attain homogeneous recording.

SUMMARY OF THE INVENTION

A main object of the invention is to provide a volume holographic memory-based optical information-recording/reproducing apparatus which is capable of shaping an interference area for a reference beam and a signal beam within a recording medium more easily than by waveform shaping using a lens.

Another object of the invention is to provide a volume holographic memory-based optical information recording/reproducing apparatus which is able to record information in a holographic memory precisely and reproduce the recorded information from the holographic memory accurately.

Further object of the invention is to provide a volume holographic memory-based optical information-recording/reproducing apparatus which is capable of reducing crosstalk between adjacent pixels and having an broader tolerance of positioning.

Still further object of the invention is to provide a volume holographic memory-based optical information-recording/reproducing apparatus which is capable of carrying out homogeneous recording.

To achieve the above objects, the present invention provides a volume holographic memory-based optical information-recording/reproducing apparatus in which a recording medium is mounted for recording a three-dimensional optical interference pattern formed by at least two coherent light beams as spatial changes in refractive index of the recording medium, said apparatus including a signal beam optical system for applying a coherent signal beam to the recording medium via a Fourier transform lens, a reference beam optical system for applying a coherent reference beam to the recording medium, means for causing the reference beam to intersect with the signal beam within the recording medium and changing an angle of intersection between the reference beam and the signal beam, and means for detecting diffracted light of the reference beam diffracted from the recording medium.

The apparatus according to the invention is characterized by comprising light intensity offset means arranged in an optical path of the signal beam optical system and an optical path of the reference beam optical system, for shifting a distribution of a light intensity of the signal beam and a light intensity of the reference beam, respectively, within an area in the recording medium in which the signal beam and the reference beam intersect with each other.

According to this volume holographic memory-based optical information-recording/reproducing apparatus, it is possible to shape an interference area for the reference beam and the signal beam within a recording medium more easily than by waveform shaping using a lens.

Preferably, the light intensity distribution-offset means comprises liquid crystal panels arranged in the vicinity of the recording medium in a manner such that the liquid crystal panels are each perpendicular to a plane on which the signal beam and the reference beam extend, each of the liquid crystal panels being electrically controlled to undergo a change and having an optically transparent portion and an optically opaque portion with an optical axis of the signal beam or the reference beam extending through a border dividing between the optically transparent portion and the optically opaque portion.

Preferably, the light intensity distribution-offset means comprises partial shades arranged in the vicinity of the recording medium in a manner such that the partial shades are each perpendicular to a plane on which the signal beam and the reference beam extend, the partial shields each having an optically transparent portion and an optically opaque portion with an optical axis of the signal beam or the reference beam extending through a border dividing between the optically transparent portion and the optically opaque portion.

More preferably, each of the partial shades is formed by a transparent flat board, and the optically opaque portion comprises diffraction gratings.

Preferably, the light intensity distribution-offset means comprises space optical modulators arranged in the optical path of the signal beam optical system and the optical path of the reference beam optical system, respectively, for modulating the signal beam and the reference beam in a manner such that spots in the recording medium symmetric with respect to optical axes of the signal beam and the reference beam and apart from the optical axes are assigned to portions of the reference beam and the signal beam which are smaller in light intensity.

Preferably, the means for detecting the diffracted light comprises a charge coupled element image sensor having a plurality of light-receiving pixel elements disposed on a plane perpendicular to an optical axis of the diffracted light from the recording medium at predetermined intervals of a pitch, a pinhole array formed by a flat shade board having a plurality of apertures formed at the predetermined intervals of a pitch in a manner corresponding to the light-receiving pixel elements and held apart from the light-receiving pixel elements in a manner movable along the plane in directions orthogonal to each other, and a drive element for driving the pinhole array in the directions orthogonal to each other.

More preferably, the drive element comprises a piezo-electric element.

More preferably, the pinhole array comprises a microlens array having convex lens fitted in the plurality of apertures, respectively, and shading material filling between the convex lenses.

Preferably, the pinhole array comprises a microlens array having distribution dioptric flat plate lens fitted in the plurality of apertures, respectively, and shading material filling between the distribution dioptric flat plate lenses.

Preferably, the volume holographic memory-based optical information-recording/reproducing apparatus further comprises monitoring means for detecting diffracted light leaking from a portion inside the recording medium in which the reference beam and the signal beam intersect with each other, and shutter control means for controlling blink of the signal beam, in response to a signal from the monitoring means.

According to this construction, when an erasing time constant is sufficiently larger than a value of a response speed during recording, by obtaining a typical erasing time constant, calculating a basic schedule from the erasing time constant, and detecting formation of the diffraction gratings during recording, it is possible to record information by feedback control carried out in a manner such that diffraction efficiency estimated from the schedule is obtained.

More preferably, the monitoring means comprises means that is provided with a filter for decreasing quantity of received light and detects the diffracted light of the reference beam from the recording medium.

More preferably, the volume holographic memory-based optical information-recording/reproducing apparatus further comprises monitoring beam-irradiating means for irradiating the portion inside the recording medium in which the reference beam and the signal beam intersect with each other with a monitoring beam which is different from the signal beam in wavelength, and means for moving the monitoring beam-irradiating means in a manner such that the monitoring means can receive the monitoring beam reflected from the portion inside the recording medium.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

The invention will now be described in detail with reference to drawings showing embodiments thereof. Identically labeled elements appearing in different ones of the figures refer to the same element in the different figures but may be not be referenced in the description for all figures.

In the following embodiments in each of which a volume holographic memory is applied to an optical information recording/reproducing apparatus, description is made by using an angle multiple recording method for carrying out multiple recording in an identical space within a recording medium by changing the irradiation angle of a reference beam. In the angle multiple recording method, an amount of information corresponding to one page of image is recorded/reproduced using the reference beam irradiated at a preset irradiation angle, and by irradiating the reference beam at a substantially identical spot of the recording medium at different irradiation angles, an amount of information corresponding to a plurality of pages is recorded/reproduced. In this case, each irradiation angle is required to have a range large enough to prevent occurrence of crosstalk between pages of images adjacent to each other when the stored information is read out.

A recording medium used in the present embodiment is made of a photorefractive crystal for recording three-dimensional optical interference patterns as spatial changes in refractive index occurring within the crystal. More specifically, a crystal of lithium niobate (LN) is generally used. LN is suitable for holographic multiple recording because its lifespan is relatively long, fixation is possible, and it is easy to deal with.

Figure 1:
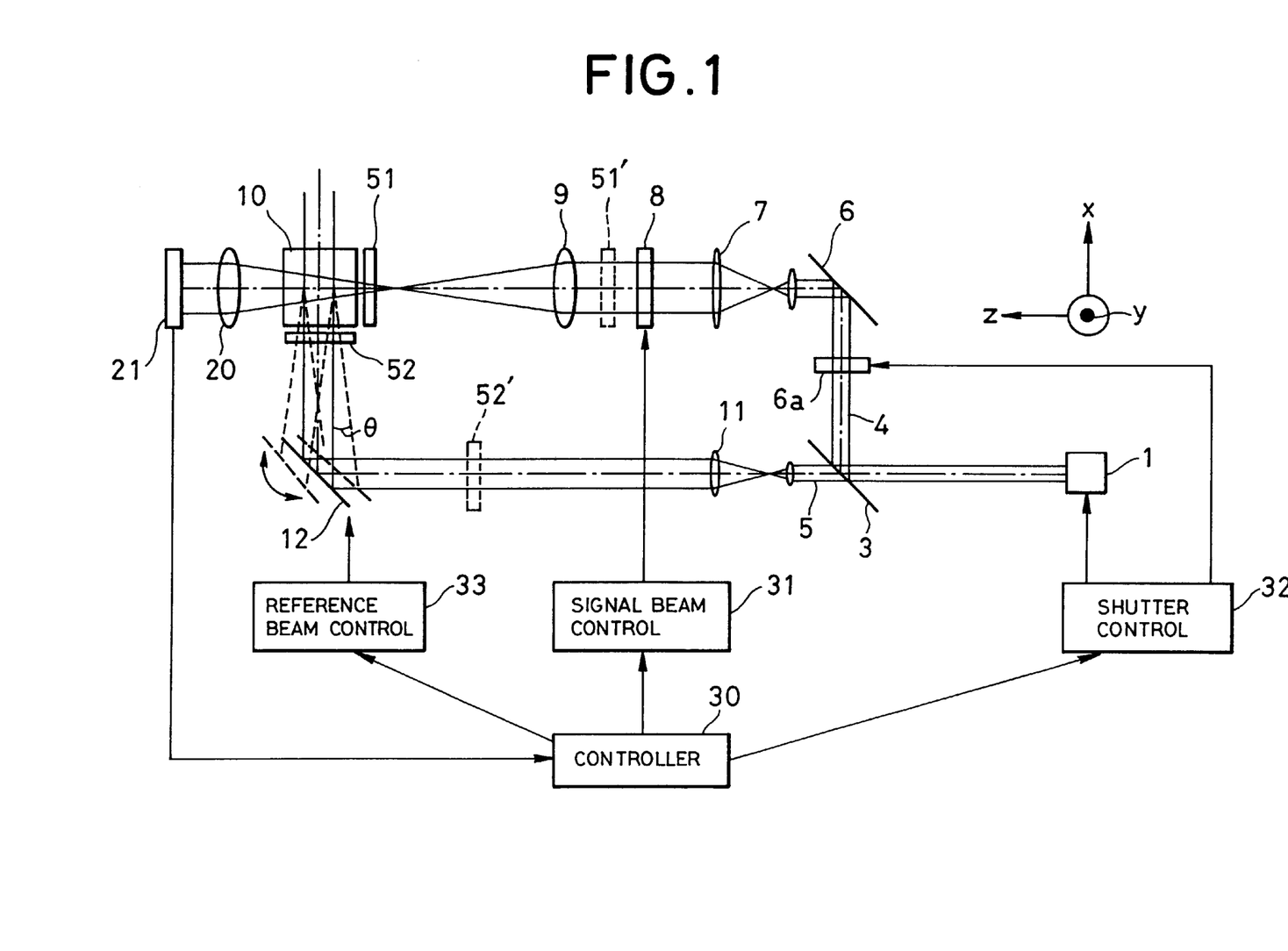
FIG. 1 is a block diagram showing a volume holographic memory-based optical information-recording/reproducing apparatus according to the present invention.

FIG. 1 shows a diagram of an optical information-recording/reproducing apparatus including a volume holographic memory according to the present invention.

A light beam emitted from a laser source 1 is split by a translucent mirror 3 into a signal light beam 4 and a reference light beam 5. The two light beams are guided into an optical path of a signal beam optical system and an optical path of a reference beam optical system, respectively. Generally, in a laser source, a light beam emitted as a linearly polarized light is modulated by an ND (neutral density) filter such that it has a predetermined light intensity. Then, a time period over which a recording medium is illuminated with the light beam is controlled by an automatic shutter controlled from outside. It is noted that a half-wave plate may be used to control a direction of deflection of the beam incident on the recording medium.

The signal beam 4 reflected off the translucent mirror 3 passes through a shutter 6a, a reflecting mirror 6, a light beam expander 7, a spatial light modulator 8, and a Fourier transform lens 9 to impinge on a recording medium 10. More specifically, the signal beam 4 is expanded by the beam expander 7 into a parallel light beam having a predetermined diameter, spatially modulated by the spatial light modulator 8 in accordance with recording page data, i.e.

spatially modulated to a two-dimensional grating patterns according to the permission or inhibition of transmission of each pixel, then subjected to Fourier transform by the Fourier transform lens 9 and converged on the recording medium 10, thereby forming an image in the recording medium as a Fourier transform image. Also in the present embodiment, the direction of deflection of the signal beam 4 may be controlled by the half-wave plate, and adjusted by an ND filter to have a predetermined light intensity.

On the other hand, in the reference beam optical system, the reference beam 5 passes through a light beam expander 11 and a pager reflecting mirror 12 to impinge on the recording medium 10. The signal beam 4 and the reference beam 5 intersect with each other inside the recording medium 10. The reference beam 5 which passed through the translucent mirror 3 is expanded by the beam expander 11 into a parallel light beam having a predetermined diameter. At this time point, the reference beam 5 may have its light intensity further adjusted by an ND filter. Thereafter, the reference beam 5 is controlled by the pager reflecting mirror 12 to be applied to the recording medium at respective predetermined angles. Paging operation of the pager reflecting mirror 12 is controlled by sliding of the mirror 12 and changing of its angle of deflection such that an identical portion of the recording medium is irradiated with reference beams 5 having respective different incidence angles.

The signal beam 4 passed through the Fourier transform lens 9 and the reference beam 5 reflected by the pager mirror 12 cooperate to form a hologram within the recording medium 10. More specifically, in recording data, the signal beam 4 and the reference beam 5 are irradiated on the recording medium 10 simultaneously, and changes in refractive index occurring in the recording medium 10 are recorded as an interference pattern. A time period during which a hologram is formed is controlled with the automatic shutter of the laser source.

In reproducing the recorded optical information, the shutter 6a is closed, and hence only the reference beam 5 reflected by the pager reflecting mirror 12 is irradiated on the recording medium 10, whereby diffracted light forms an image on a two-dimensional photodetector array 21 including a CCD via an inverse Fourier transform lens 20. Pixels of the CCD and pixels of an LCD are adjusted such that they have a one-to-one correspondence between them. The correspondence pattern between the CCD pixels and the LCD ones may be not only one-to-one but also one-to-four, four-to-one, or the like. Thus, when the information is reproduced, it is possible to read data by applying the reference beam 5 alone to the interference pattern recorded in the recording medium 10.

In this apparatus, a digital signal to be recorded is received to a controller 30 and subjected to processing such as addition of an error-correcting code, binary coding, etc. Then, the resultant digital signal is converted by a signal beam control driver 31 to a signal indicative of a page image array, and data of each page is delivered as a page image to the transmission spatial light modulator 8 such as an LCD to form image data. The controller 30 controls a time period over which the recording medium 10 is to be irradiated with the two beams with the image data existing in the spatial light modulator 8 via a shutter control driver 32 that automatically shuts the laser source.

At the same time, the controller 30 moves the pager reflecting mirror 12 by means of a reference beam control driver 33 to change an angle position of the mirror 12 in accordance with the image data, whereby the reference beam 5 provided to enter the recording medium 10 at a predetermined incidence angle ($\theta$) is applied to the the recording medium 10 over a predetermined time period to write a hologram therein.

Subsequently, the sequence of operations for sending a page image, setting the incidence angle of the reference beam 5, and recording a hologram is repeatedly carried out. One page of information is stored per incidence angle variably set to the reference beam 5.

The process of information reproduction is as follows: the controller 30 causes the shutter 6a to close, and moves the pager reflecting mirror 12 via the reference beam control driver 33 to set the incidence angle of the reference beam 5 to a predetermined value which is identical to one of the values determined when the information was recorded; only the reference beam is applied to the recording medium 10; and a diffracted light from one of the recorded interference patterns is focussed with the inverse Fourier transform lens 20 to form an image of the reproduced page on the two-dimensional photodetector array 21 including the CCD. The light intensity of the reference beam is required to set to a sufficiently low value, compared with the value used in recording, to prevent the recorded information from being erased. Further, it is required to set the shutter control driver 32 and the reference beam control driver 33 for proper control of the irradiation time of the reference beam such that a photodetector output can have a proper S/N (signal-to-noise) ratio. The controller 30 carries out signal processing, such as decoding, error correction processing, etc., of the photodetector output, whereby the information recorded in the recording medium 10 is read out.

Figure 2:
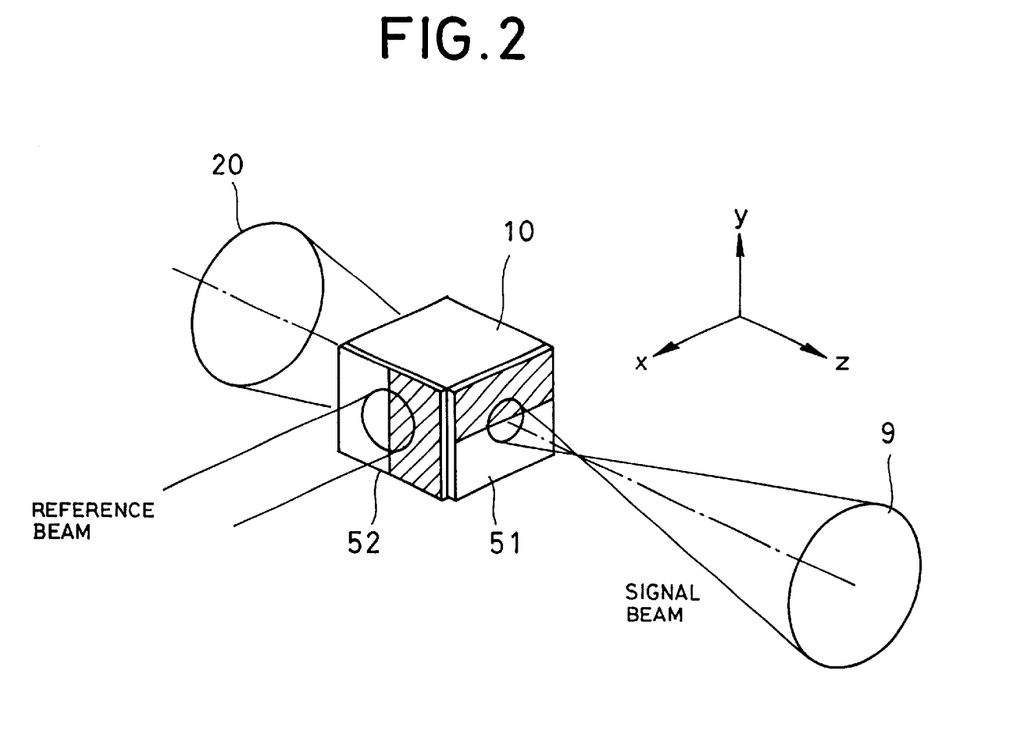
FIG. 2 is a perspective view showing a recording medium and a spatial optical modulator.

According to the volume holographic memory-based optical information-recording/reproducing apparatus of the present embodiment, as shown in FIGS. 1 and 2, a second spatial light modulator 51 is arranged on an incoming signal beam side of the recording medium 10, while a third spatial light modulator 52 is on an incoming reference beam side of the same. The second and third spatial light modulators 51, 52 are partial shades arranged in the immediate vicinity of the recording medium 10 such that they are each perpendicular to a plane on which the signal beam and the reference beam extend. Each of these spatial light modulator 51, 52, which may be formed by a transparent glass plate coated with black ink, is divided by a central line passing through the optical axis of the signal beam or the reference beam into an optically transparent portion 53 and an optically opaque portion 54 which are substantially equal to each other in area. Although in this embodiment, the portions 53 and 54 have an identical area, this is not limitative. It is preferred that the spatial light modulators are each formed by a liquid crystal shutter such as an LCD, or a hologram plate. When the LCD is employed, a beam shape is electrically controlled, while when a hologram plate is employed, the same is controlled by changing hologram plates.

Figure 3A:
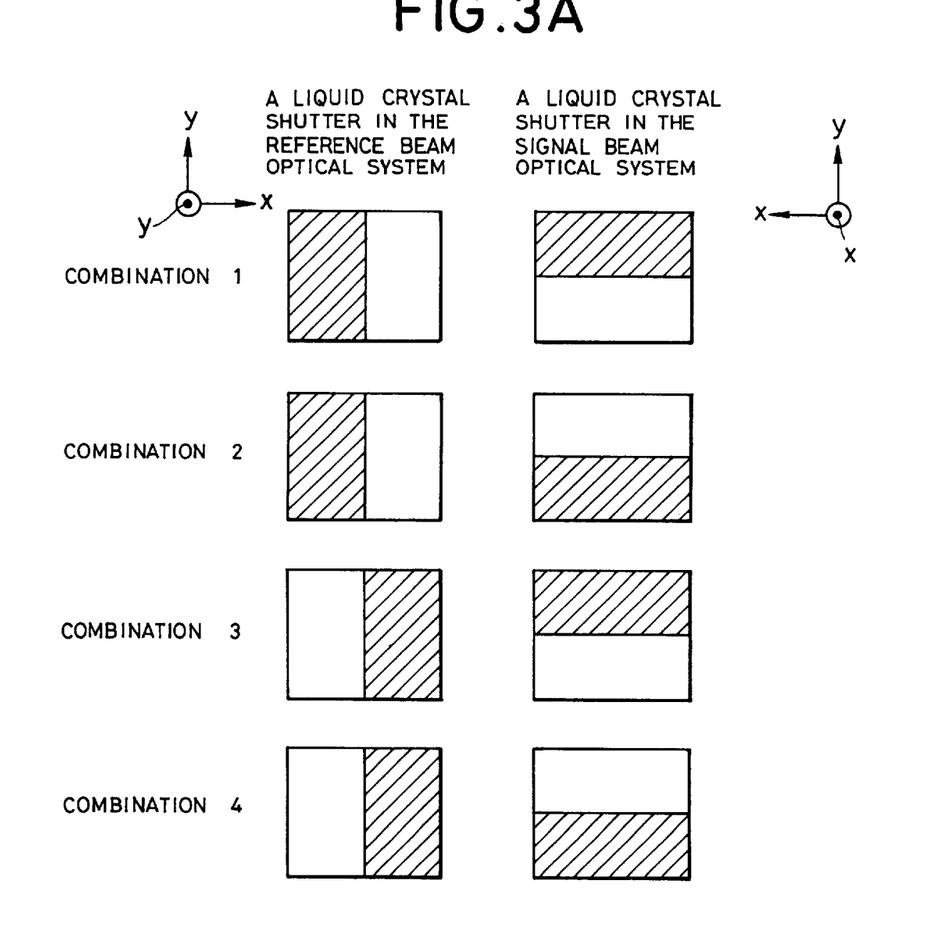
FIGS. 3A and 3B are views explaining the operations of the spatial optical modulator.
Figure 3B:
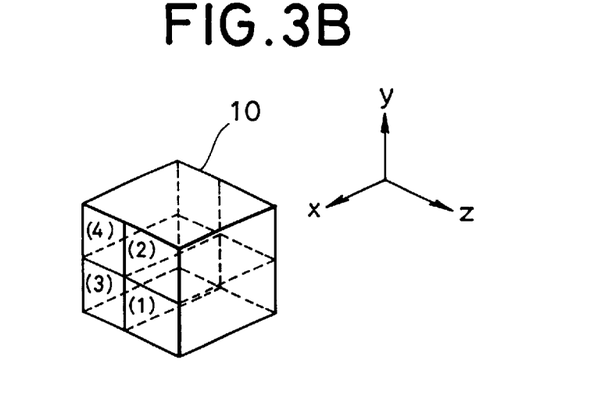

As shown in FIG. 2, data recording is performed with the reference beam bisected into upper and lower portions with respect to a vertically central point of the signal beam. For example, the second and third spatial light modulators 51, 52 may be formed by respective liquid crystal shutter panels each arranged in the vicinity of the recording medium 10 perpendicularly to the plane on which the signal beam and the reference beam extend, and each electrically controlled to have the optically transparent portion and the optically opaque portion identical to each other in area with the central line of the signal beam or the reference beam as a border. In this case, the reference beam and the signal beam enter the recording medium 10 in a manner partially blocked as shown in combinations of patterns 1 to 4 in FIG. 3A. In reproducing data, the data is read out by adjusting the reference beam by the spatial light modulators to have the same pattern as employed in recording the data. The reference beam and the signal beam intersect with each other in any one of four portions (1) to (4) of the recording medium shown in FIG. 3B, respectively corresponding to the combination patterns 1 to 4 in FIG. 3A, to form an interference pattern, and the interference pattern is recorded as changes in the refractive index occurring within the recording medium. Spots in the recording medium 10 symmetric with respect to the optical axes of the two beams and apart from the same are assigned to portions of the reference beam and the signal beam which are smaller in light intensity.

As described above, the signal beam and the reference beam are shaped by the use of the light beam expanders, etc. such that each of them is applied to the recording medium 10 with an appropriate size in cross section, and then the beam shapes are controlled by the second and third spatial light modulators 51, 52, respectively, which are provided at intermediate portions of the respective optical paths. The second and third spatial light modulators (light intensity distribution-partializing means) 51, 52 are arranged in the optical path of the signal beam and that of the reference beam, respectively, for partializing the distribution of the light intensity of each of the beams in an area within the recording medium 10 in which the two beams intersect with each other. Therefore, it is also possible to arrange the second and third spatialo light modulator 51' and 52' at respective intermediate portions of the optical paths of the two beams shown in FIG. 1.

Figure 4:
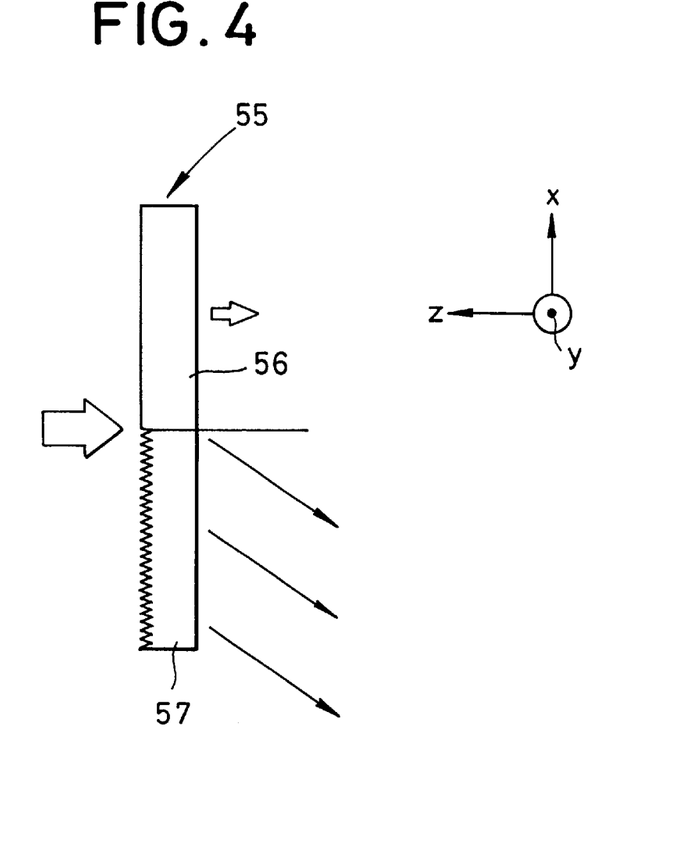
FIG. 4 is a sectional view of a hologram plate.

FIG. 4 shows another embodiment of the present embodiment in which each of the spatial modulators comprises a hologram plate. The hologram plate 55 formed by transparent plane paralleled plates has an optically transparent portion 56 and an optically opaque portion 57. The transparent portion 56 permits the light beam to pass therethrough to be applied to the recording medium 10, while the opaque portion 57 is formed with diffraction gratings. The diffraction gratings prevent the light beam from reaching the recording medium by diffracting the same.

Next, a further embodiment of the present invention will be described.

Figure 5:
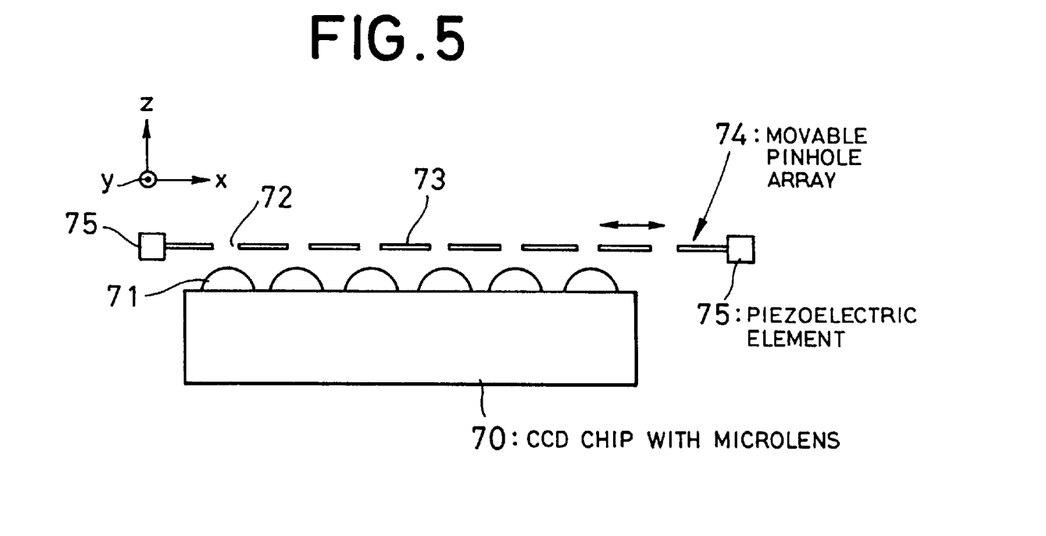
FIG. 5 is a view showing another embodiment of a two-dimensional photodetector array according to the invention.

As shown in FIG. 5, in this embodiment, the two-dimensional photodetector array 21 in FIG. 1, i.e. light-detecting means for detecting a reproduced diffracted light beam includes a CCD 70 arranged on a plane perpendicular to the optical axis of the diffracted light from the recording medium, a pinhole array 74 comprising of a flat shade 73 having a plurality of apertures 72 formed therethrough with a predetermined pitch in a manner corresponding to a matrix of light-receiving pixel elements 71 on the CCD 70, and a drive element 75 for driving the pinhole array 74 in the directions orthogonal to each other. The flat shade 73 is held apart from the matrix of light-receiving pixel elements 71 in a manner movable along the CCD plane in directions orthogonal to each other. The drive element 75 may comprise piezoelectric elements.

Conventionally, an actual modularizing operation in a process of assembling and adjusting modules of a volume hologram-recording/reproducing apparatus using Fourier transform lenses requires extremely accurate positioning, for example, for mounting CCD photoreceptive elements at predetermined space intervals with an assembly tolerance of closer than space intervals of the CCD photoreceptive elements, so that the manufacturing step is a troublesome and time-consuming one. The two-dimensional photodetector array 21 of the present embodiment makes it possible to eliminate the above incovenience. That is, the movable pinhole array 74 driven by the piezoelectric elements is disposed slightly apart from the CCD pixels 71, which makes the assembly tolerance less close and permits fine adjustment after assemblage.

Figure 6A:
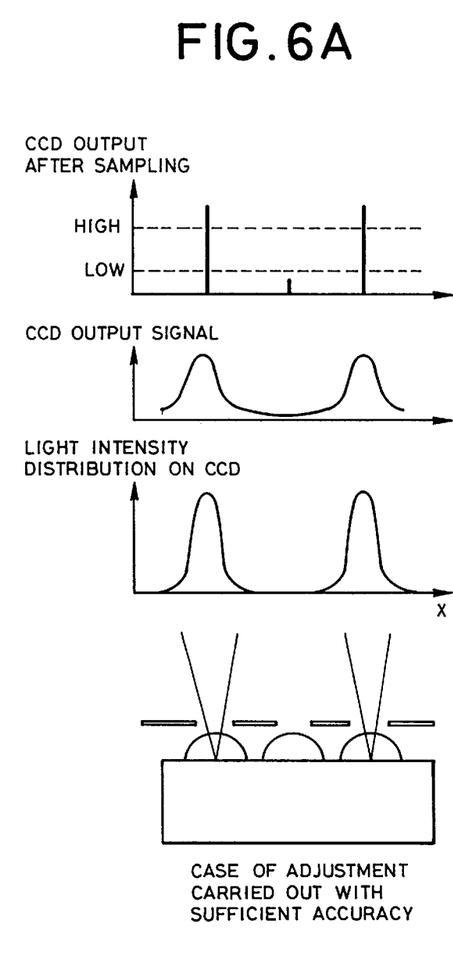
FIGS. 6A and 6B are views explaining the operations of the two-dimensional photodetector array.
Figure 6B:
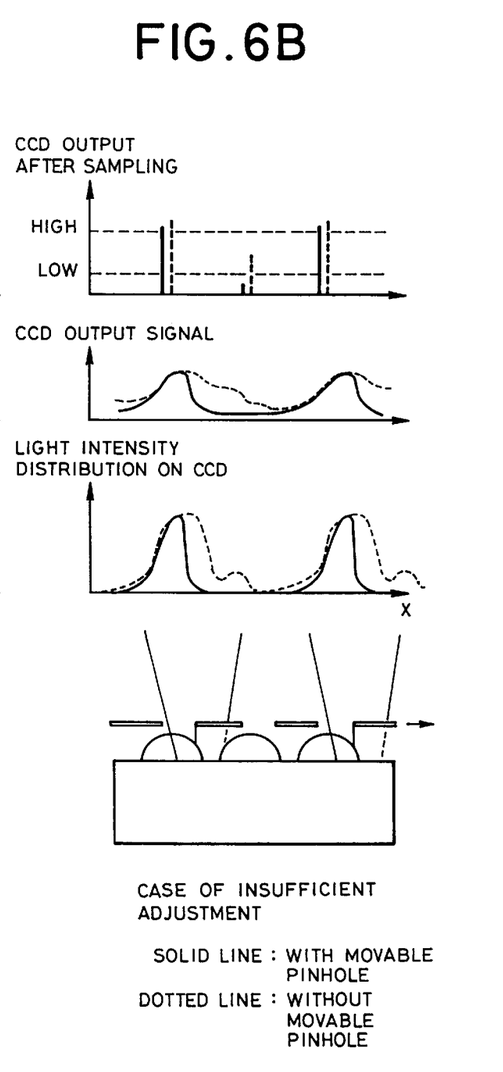

Further, the movable pinhole array 74 according to the embodiment can provide the following effects: FIG. 6A shows a case in which an optical adjustment actually carried meets criteria, while FIG. 6B shows cases in which the same is insufficient. In one case shown in FIG. 6B in which the optical adjustment is carried out without the movable pinhole array 74, as indicated by dotted lines in the figure, outputs from adjacent pixel elements which should not receive light are also contained in the distribution of light intensity on the CCD. As a result, a contrast in an image formed by the CCD output signals is reduced. That is, out of the CCD outputs after sampling, ones for use in imaging are affected by crosstalk from adjacent pixel elements, so that pixels which are originally expected to be below a level indicated at Low in the figure assume a medium value. This crosstalk actually causes serious degradation of the quality of a reproduced image.

On the other hand, FIG. 6B show an optical adjustment in which a movable pinhole array is arranged slightly apart from the CCD pixels. An open area ratio of the CCD is reduced by the pinhole array as indicated by solid lines in the figure, whereby the amount of stray light incident on adjacent CCD pixels is decreased.

Figure 7:
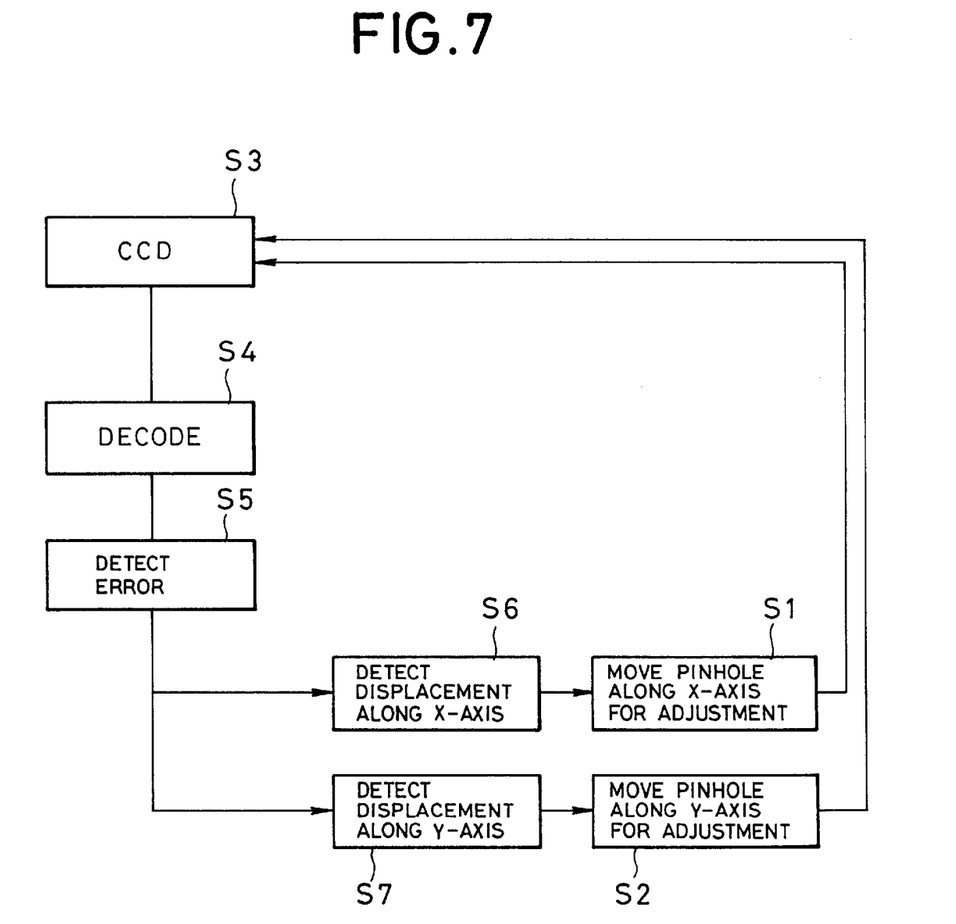
FIG. 7 is a flowchart showing a procedure for position-controlling a pinhole array.

Further, FIG. 7 shows a procedure which is performed by the controller for the optimization of signal intensity. The drive elements 75 such as piezoelectric elements move the pinhole array 74 in the X and Y directions with reference to x and y coordinates so as to prevent the beam from entering the adjacent pixels (steps S1, S2). The controller obtains CCD outputs(step S3), demodulates them(step S4), and detects an error(step S5). Respective amounts of displacement in the X and Y directions are detected based on the results of the error detection (steps S6, S7), and adjustment is repeatedly carried out according to the detected amount of displacements in t he X and Y directions for optimization of signal intensity. The piezoelectric elements for driving the movable pinhole array only has an ability to move the pinhole array by ±0.5 pixel for the adjustments.

Assuming that the open area ratio of the CCD limited by the movable pinhole array is equal to "1", an optimum open area of the LCD on the focus on the opposite side of the Fourier transform lens facing the CCD is in a range of 1 to 0.5.

Figure 8A:
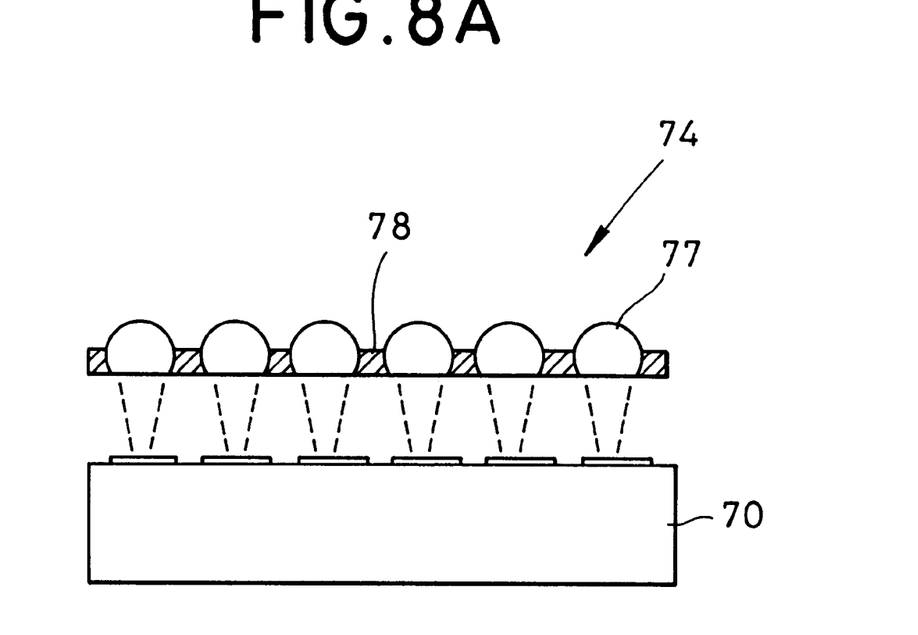
FIGS. 8A and 8B are views showing another embodiment of a two-dimensional photodetector array according to the invention.
Figure 8B:
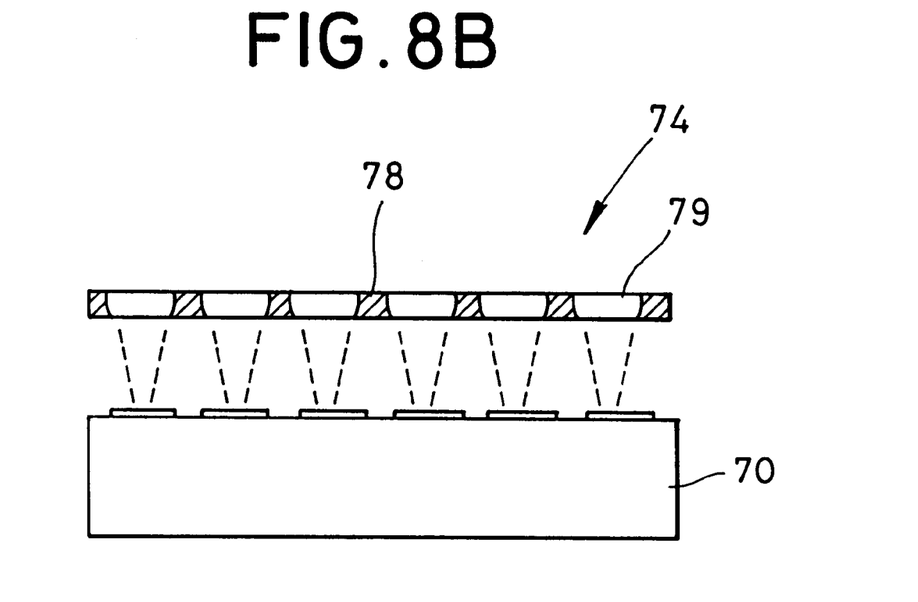

FIG. 8A shows a further embodiment of the invention, in which a pinhole array 74 in a two-dimensional photodetector array 21 comprises a microlens array having a plurality of apertures in each of which a convex lens 77 is received and a shielding material 78 filling space between the convex lenses 77. FIG. 8B shows s still further embodiment, in which the pinhole array 74 comprises a microlens array having a plurality of apertures in each of which a distribution dioptric flat plate lens 79 is received and the shielding material 78 filling space between the lenses 79.

Next, a still further embodiment will be described.

According to this embodiment, the volume holographic memory-based optical information-recording/reproducing apparatus is provided with monitoring means for detecting diffracted light leaking from a portion within the recording medium in which the reference and signal beams intersect with each other. The monitoring means supplies a control signal to shutter control means for controlling blink of the signal beam.

Figure 9A:
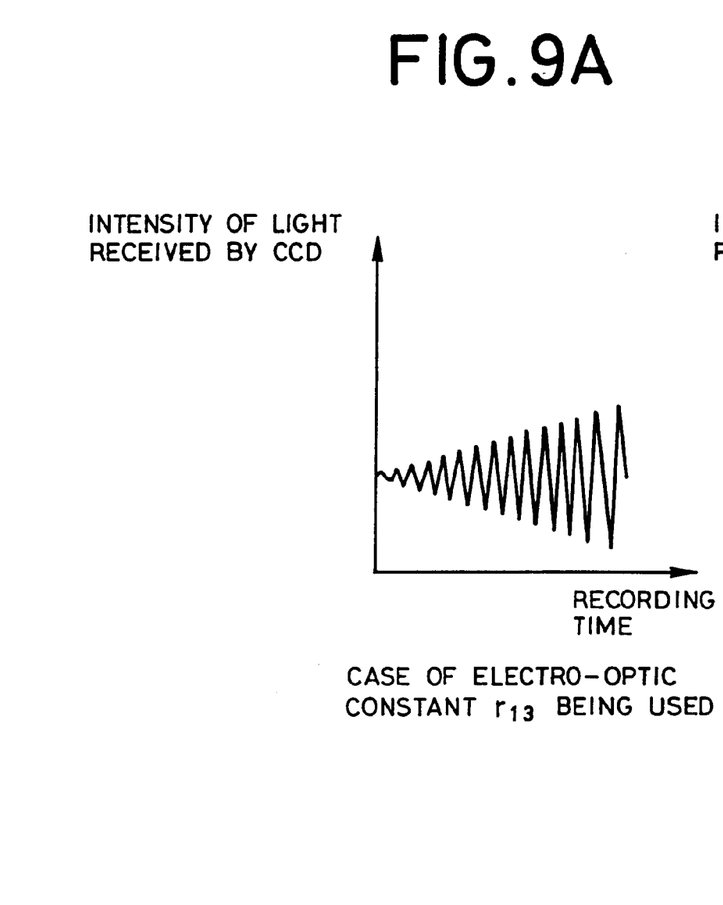
FIGS. 9A and 9B are views explaining characteristics of a further embodiment of a recording medium according to the invention.
Figure 9B:
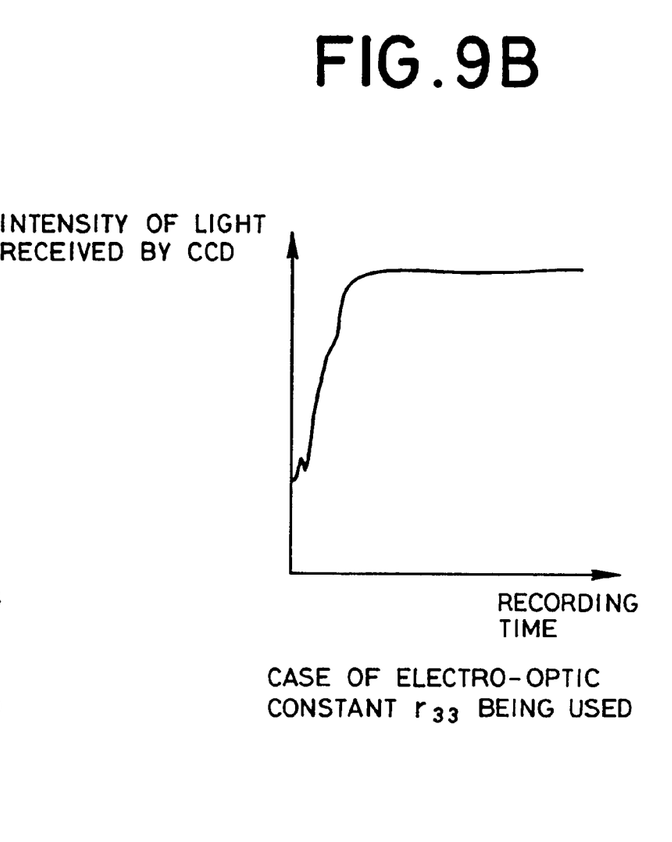

As shown in FIGS. 9A and 9B, basically, holographic recording is to record optical mode coupling between a signal beam and a reference beam in a recording medium of photorefractive crystal as changes in refractive index occurring within the recording medium. The light beam which the CCD receives has two modes with respect to its intensity. When light power is exchanged periodically between the reference beam and the signal beam, for example, in a recording medium of $LiNbO_3$ doped with Fe and positioned such that changes in the refractive index occur within the crystal dependently on an electro-optic constant $r_{13}$, as shown in FIG. 9A, an image which is being recorded blinks repeatedly with formation of diffraction gratings. On the other hand, with respect to a recording medium positioned such that changes in refractive index occur within the crystal due to a photorefractive effect dependently on an electro-optic constant $r_{33}$, FIG. 9B shows that the reference beam is absorbed in the recording beam.

In these phenomena, as recording in the recording medium proceeds, the shift or transfer of the light power becomes more pronounced. That is, FIG. 9A shows that the contrast in light intensity of the diffracted light between light and dark caused by blinking is enhanced, while FIG. 9B shows that an amount of the diffracted light simply increases.

Figure 10:
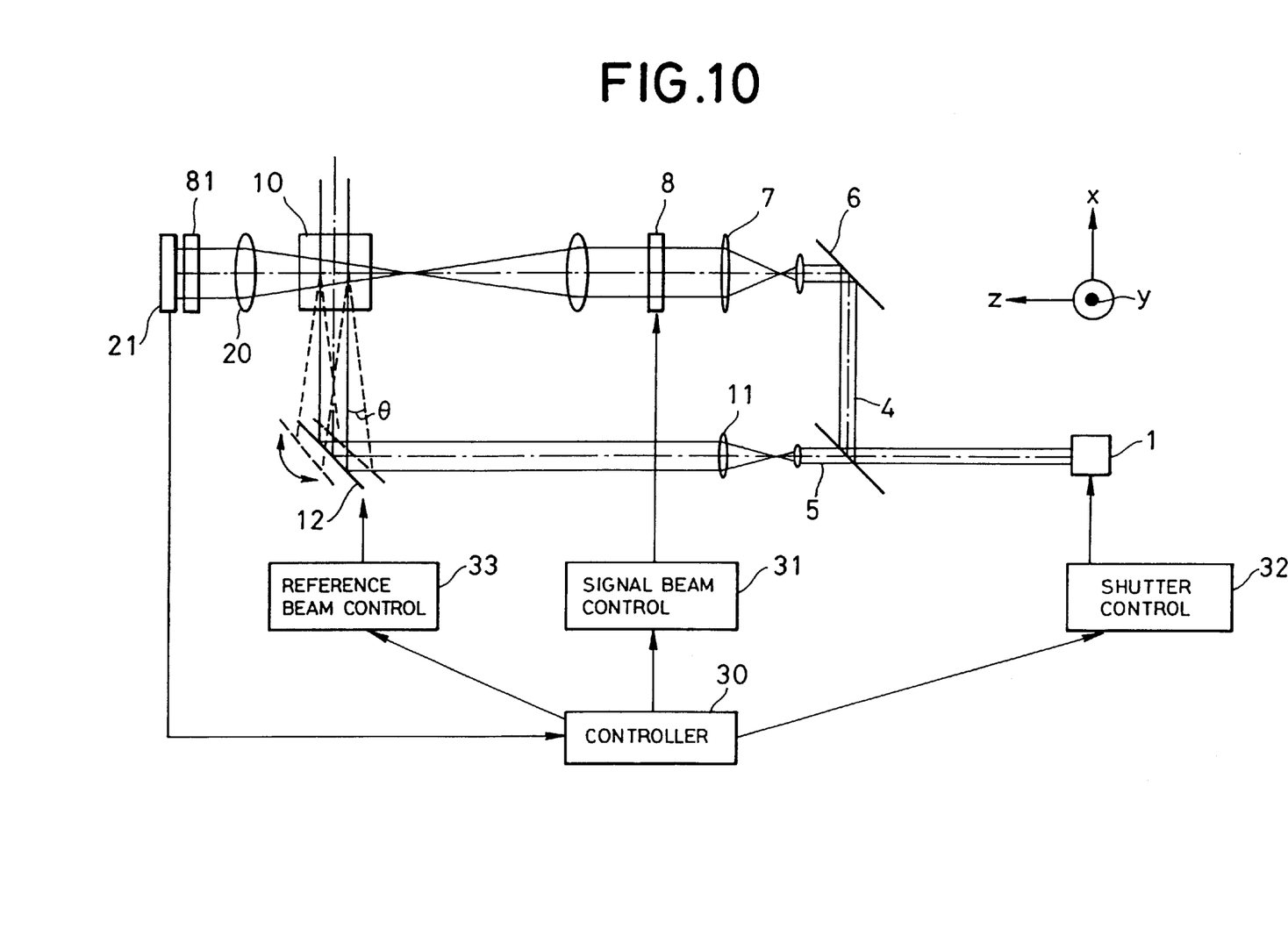
FIG. 10 is a block diagram showing another embodiment of a volume holographic memory-based optical information-recording/reproducing apparatus according to the invention.

In the above embodiments, the monitoring means is provided with a filter for decreasing an amount of received light. FIG. 10 shows an apparatus according to the present embodiment. Component parts and elements corresponding to those of the above embodiments shown in FIG. 1 are indicated by identical reference numerals, and description thereof is omitted. In an optical system, an adjustable filter 81 which is capable of attenuating light over a large adjustable range is provided for the two-dimensional photodetector array 21 of the CCD camera, and a combination of a transmitted signal beam and a diffracted reference beam is detected by increasing the filter's attenuation during recording. Diffraction efficiency is calculated back from the luminance of the reproduced image for real-time and optimum recording.

When there is a contrast in light intensity of the diffracted light between light and dark caused by blinking as shown in FIG. 9A, luminance difference between the light and the dark blinking is monitored to keep track of the recording state and control the same.

In such a case as shown in FIG. 9B, the luminance of an image which is being recorded increases with formation of diffraction gratings, so that the recording state is controlled such that the luminance reaches a predetermined level.

Figure 11:
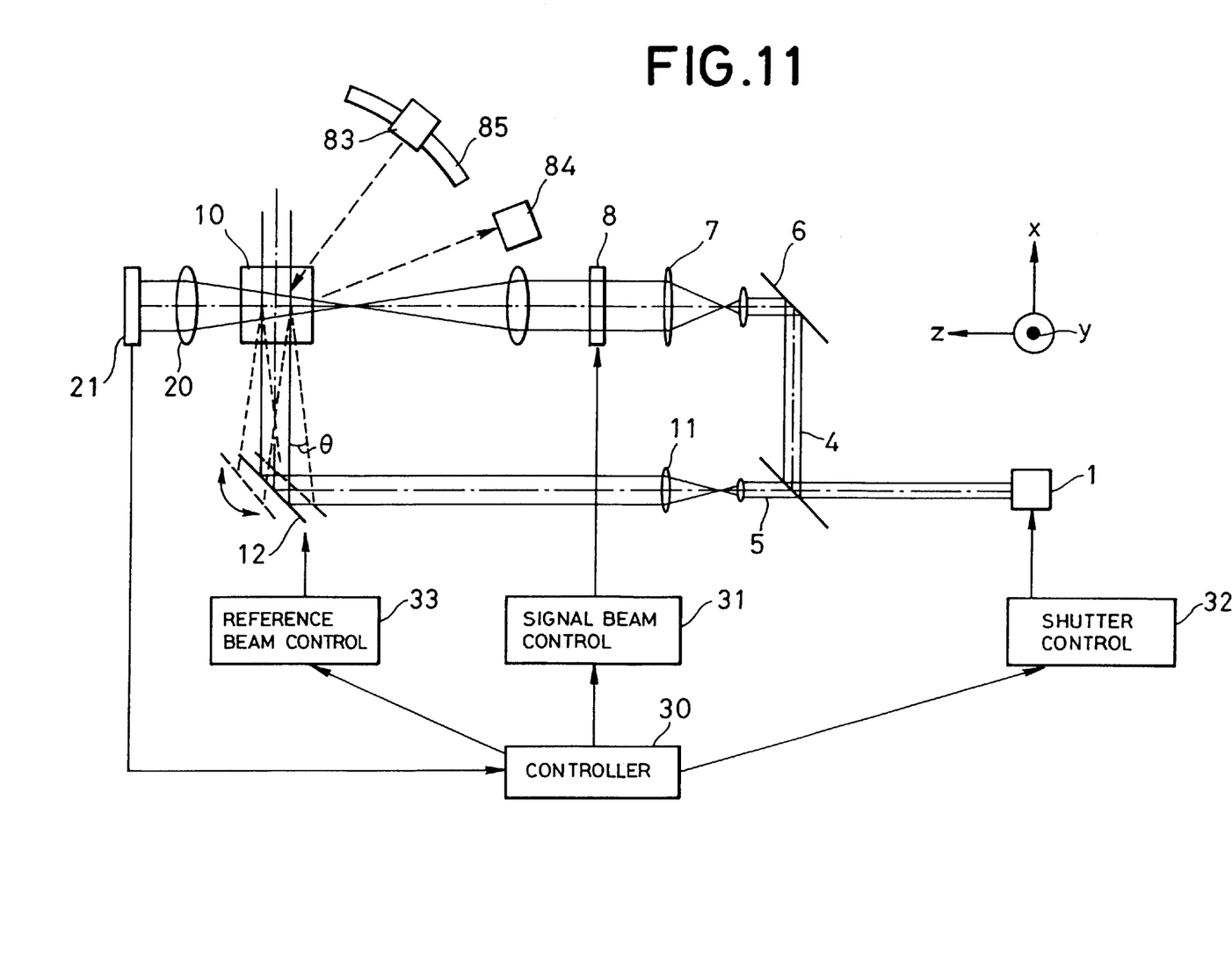
FIG. 11 is a block diagram showing further embodiment of a volume holographic memory-based optical information-recording/reproducing apparatus according to the invention.

Next, a still further embodiment of the invention will be described with reference to FIG. 11. Component parts and elements corresponding to those of the above embodiment shown in FIG. 1 are indicated by identical reference numerals, and description thereof is omitted. An apparatus of this embodiment includes a laser 83 as monitoring beam-irradiating means and a drive mechanism 85. The laser 83 generates a monitoring beam whose wavelength is different from that of the signal beam to supply the beam to the portion within the recording medium 10 in which the reference and signal beams intersect with each other. The drive mechanism 85 moves the monitoring beam-irradiating means such that a light-receiver 84 which serves as monitoring means, such as a two-dimensional photodetector array, can receive the monitoring light reflected from the portion within the recording medium 10.

The laser 83 uses a laser beam which has a wavelength different from that of the signal beam. The laser 83 may comprise a He—Ne laser beam to generate a monitoring beam. Since the laser beam has a wavelength different from that of the signal beam, its Bragg angle is also different from that of the signal beam. This makes it possible to add a monitoring optical system to the conventional optical system for the recording and reproduction of information. When an angle multiple recording method is employed as the multiple recording method, it is necessary to change the incidence angle of the monitoring beam from the monitoring optical system as shown in FIG. 11. Therefore, the laser 83 and the light-receiver 84 should be moved by the drive mechanism 85 as shown in the figure, thereby changing the angle of the monitoring beam incident on the recording medium. The drive mechanism 85 may include a movable stage and a galvano mirror, two pairs of galvano mirrors, or an audio optical deflecting (AOD) element. The monitoring optical system makes it possible to monitor formation of diffraction gratings during recording independently. The resultant information is fed back for use in controlling a recording time period.

Assuming that the light-receiver 84 for monitoring comprises a CCD camera, it is possible to obtain a reproduced image of data in real time while the data is being recorded. Therefore, it is also possible to calculate an error ratio of the recording from the reproduced image and perform more appropriate control of the recording in real time.

The light-receiver 84 may comprise a photodiode. In this case, adjustment such as pixel alignment can be eliminated, and hence installation becomes easier. The state of formation of diffraction ratings can be kept track of by monitoring the diffraction intensity.

In a conventional holographic memory using lithium niobate (LN), for example, information is recorded by utilizing the photorefractive effect. Since the photorefractive effect has no definite threshold value for recording, it is possible to record a relatively feeble light below 1 ($W/cm^2$). However, the photorefractive effect has no threshold value for record erasure, either, so that a record is degraded even by irradiation thereon for multiple recording or reproduction.

Now, the present embodiment will be described in further detail based on an example of a 1000-page multiple recording operation.

If recording is performed on 1000 pages with an identical recording power and over an identical time period per page, a record on the first page is inevitably degraded by recording beams for recording on other pages during recording of the second page and the following ones. For this reason, assuming that the quantity of the diffracted light is equal to "1" immediately after completion of recording on the first page, it is decreased to "0.94" (although the value can differ according to the characteristic of the crystal) after recording on the second page, to "0.92" after recording on the third page . . . , and eventually the quantity of the diffracted light is decreased to a very low level when recording on the 1000th page is finished. Thus, the quantity of diffracted light on each of the pages obtained after completion of the recording on the 1000th page is not even but different from page to page. A conventional technique to overcome this problem is to carry out scheduling in which the quantity of erasure of each page to be caused by recording operations of the other pages is calculated in advance, and initial recording is carried out to an increased degree corresponding to the calculated quantity. However, according to the method of the present embodiment, it is possible to compensate for the erasure in real time.

Figure 12:
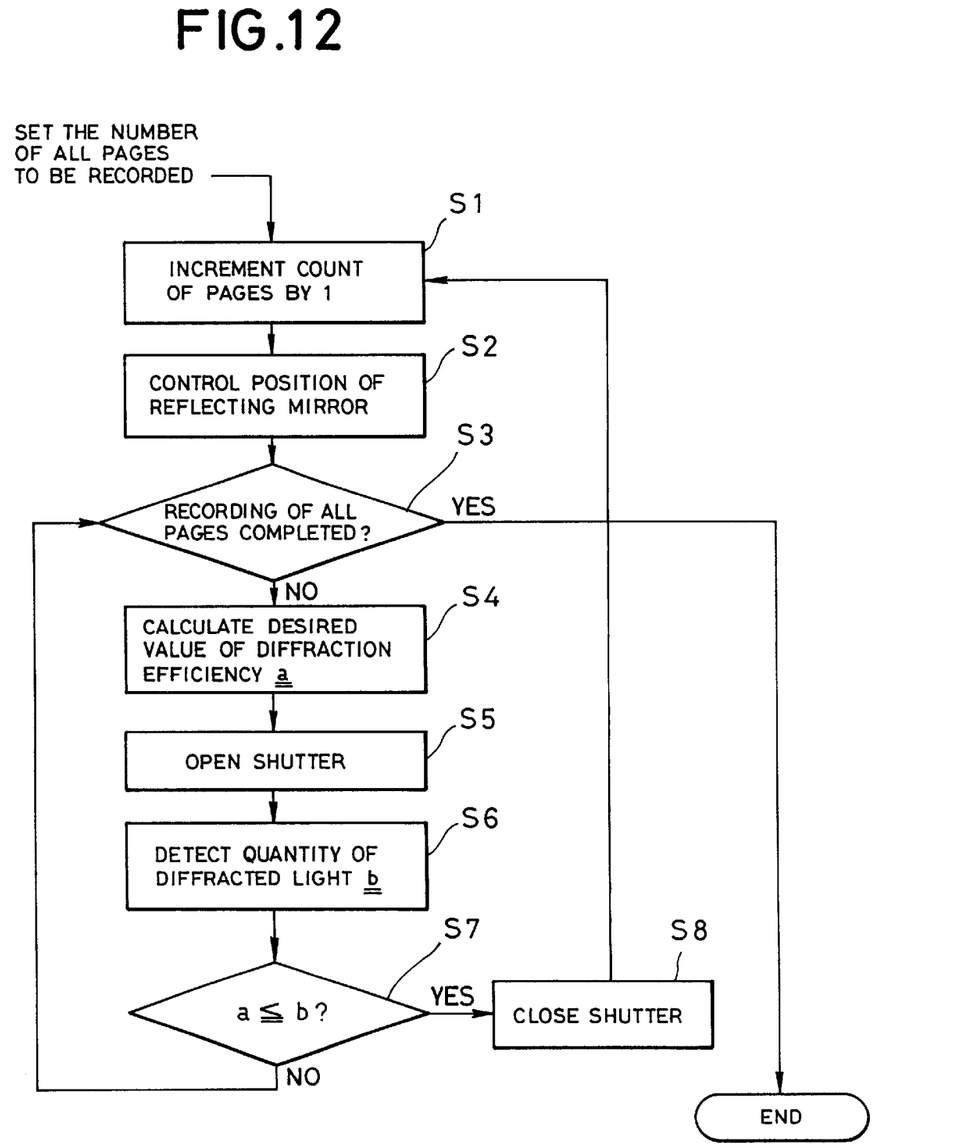
FIG. 12 is a flowchart showing a procedure of schedule control.

FIG. 12 shows an example of a recording process carried out by the apparatus according to the present embodiment. As shown therein, first, the number of all recording pages is set, and the number of recorded pages is counted from an initial value thereof in step S1. Then, position control of the reflecting mirror for the monitoring beam is performed in step S2, and it is determined in step S3 whether or not recording of all the pages is completed. If the recording is not completed, a desired value a of diffraction efficiency is calculated in step S4. Then, the shutter is opened in step S5, and the quantity of diffracted light b is detected in step S6. In the following step S7, it is determined whether the quantity b is equal to or smaller than the desired value a. If the quantity b is equal to or larger than the desired value a, the program returns to step S1, wherein the number of the pages is counted again. On the other hand, if the quantity b is larger than the desired value a, the program returns to step S3, wherein it is judged that the recording of all the pages is completed, followed by terminating the program. Thus, it is possible to monitor recording on a page-by-page basis in real time.

While there have been described preferred embodiments of the present invention, it is to be understood that various modifications and variations will occur to those skilled in the art without departing from the spirit and scope of the invention as hereinafter claimed.

What is claimed is:

1. A volume holographic memory-based optical information-recording/reproducing apparatus for recording a three-dimensional optical interference pattern formed by at least two coherent light beams on a recording medium, said interference pattern indicating spatial changes in refractive index of said recording medium, said apparatus comprising:

a signal beam optical system for transmitting a coherent signal beam to said recording medium through a Fourier transform lens, a reference beam optical system for transmitting a coherent reference beam to said recording medium, means for causing said reference beam to intersect with said signal beam within said recording medium to change an angle of intersection between said reference and signal beams, and means for detecting diffracted light of said reference beam diffracted from said recording medium, said apparatus further comprising light intensity distribution-offset means for controlling a distribution of a light intensity of said signal beam and a light intensity of said reference beam within said recording medium in which said signal beam and said reference beam intersect with each other, said light intensity distribution-offset means provided in an optical paths of both of said signal beam optical system and said reference beam optical system, respectively.

2. The apparatus according to claim 1, wherein said light intensity distribution-offset means comprises a liquid crystal panel arranged in the vicinity of said recording medium in a manner such that said liquid crystal panel is perpendicular to a plane on which said signal beam and said reference beam lie, said liquid crystal panel being electrically controlled to undergo a change, said liquid crystal panel having an optically transparent portion and an optically opaque portion with an optical axis of said signal beam or said reference beam extending through a border dividing between said optically transparent portion and said optically opaque portion.

3. The apparatus according to claim 1, wherein said light intensity distribution-offset means comprises a partial shade arranged in the vicinity of said recording medium in a manner such that said partial shade is perpendicular to a plane on which said signal beam and said reference beam lie, said partial shade having an optically transparent portion and an optically opaque portion with an optical axis of said signal beam or said reference beam extending through a border dividing between said optically transparent portion and said optically opaque portion.

4. The apparatus according to claim 3, wherein said partial shade is made of a transparent flat board, and said optically opaque portion comprises diffraction gratings.

5. The apparatus according to claim 1, wherein said light intensity distribution-offset means comprises space optical modulators provided in said optical paths of said signal beam optical system and said reference beam optical system, respectively, wherein each of said space optical modulator modulates respective one of said signal beam and said reference beam in a manner that one of small portions symmetric with respect to and apart from the optical axis of said signal in said recording medium has a stronger light intensity than that of the other.

6. A volume holographic memory-based optical information-recording/reproducing apparatus for recording a three-dimensional optical interference pattern formed by at least two coherent light beams on a recording medium, said interference pattern indicating spatial changes in refractive index of said recording medium, said apparatus comprising:

a signal beam optical system for transmitting a coherent signal beam to said recording medium through a Fourier transform lens, a reference beam optical system for transmitting a coherent reference beam to said recording medium, means for causing said reference beam to intersect with said signal beam within said recording medium to change an angle of intersection between said reference and signal beams, and means for detecting diffracted light of said reference beam diffracted from said recording medium, wherein said means for detecting said diffracted light comprises:

a charge coupled element image sensor having a plurality of light-receiving pixel elements arranged at predetermined intervals on a plane perpendicular to an optical axis of said diffracted light from said recording medium, a pinhole array having a flat shade board with a plurality of apertures formed at said predetermined intervals and facing the respective light-receiving pixel element, said pinhole array being spaced from said light-receiving pixel elements and movable in the directions parallel to said plane, and a drive element for driving said pinhole array in said directions.

7. The apparatus according to claim 6, wherein said drive element comprises a piezoelectric element.

8. The apparatus according to claims 6 or 7, wherein said pinhole array comprises a microlens array having convex lens fitted in said plurality of apertures, respectively, and shading material filling gaps between said convex lenses.

9. The apparatus according to claims 6 or 7, wherein said pinhole array comprises a microlens array having distribution dioptric flat plate lens fitted in said plurality of apertures, respectively, and shading material filling gaps between said distribution dioptric flat plate lenses.

10. A volume holographic memory-based optical information-recording/reproducing apparatus for recording a three-dimensional optical interference pattern formed by at least two coherent light beams on a recording medium, said interference pattern indicating spatial changes in refractive index of said recording medium, said apparatus comprising:

a signal beam optical system for transmitting a coherent signal beam to said recording medium through a Fourier transform lens, a reference beam optical system for transmitting a coherent reference beam to said recording medium, means for causing said reference beam to intersect with said signal beam within said recording medium to change an angle of intersection between said reference and signal beams, means for detecting diffracted light of said reference beam diffracted from said recording medium, monitoring means for detecting diffracted light leaking from a portion inside said recording medium in which said reference beam and said signal beam intersect with each other, and shutter control means for controlling blink of said signal beam in response to a signal from said monitoring means.

11. The apparatus according to claim 10, wherein said monitoring means comprises means for detecting said diffracted light of said reference beam from said recording medium and having a filter for attenuating an amount of received light.

12. The apparatus according to claim 10, further comprising:

monitoring beam-irradiating means for irradiating said portion inside said recording medium in which said reference beam and said signal beam intersect with each other with a monitoring beam having a different wavelength from that of said signal beam, and means for moving said monitoring beam-irradiating means to allow said monitoring means to receive said monitoring beam reflected from said portion inside said recording medium.

* * * * *